(12) United States Patent
Strachan et al.

(10) Patent No.: US 11,861,429 B2
(45) Date of Patent: Jan. 2, 2024

(54) RESISTIVE AND DIGITAL PROCESSING CORES

(71) Applicant: Hewlett Packard Enterprise Development LP, Houston, TX (US)

(72) Inventors: John Paul Strachan, Milpitas, CA (US); Dejan S. Milojicic, Milpitas, CA (US); Martin Foltin, Ft. Collins (CO); Sai Rahul Chalamalasetti, Milpitas, CA (US); Amit S. Sharma, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 728 days.

(21) Appl. No.: 17/049,031

(22) PCT Filed: Apr. 30, 2018

(86) PCT No.: PCT/US2018/030125
§ 371 (c)(1),
(2) Date: Oct. 20, 2020

(87) PCT Pub. No.: WO2019/212466
PCT Pub. Date: Nov. 7, 2019

(65) Prior Publication Data
US 2021/0240945 A1    Aug. 5, 2021

(51) Int. Cl.
*G06J 1/00*     (2006.01)
*G06F 17/16*    (2006.01)

(52) U.S. Cl.
CPC .............. *G06J 1/00* (2013.01); *G06F 17/16* (2013.01)

(58) Field of Classification Search
CPC .... G06G 7/16–163; G06G 7/22; G06F 17/16; G06J 1/00
See application file for complete search history.

(56) References Cited

U.S. PATENT DOCUMENTS

| | | | |
|---|---|---|---|
| 5,101,361 A | | 3/1992 | Eberhardt |
| 5,815,425 A | * | 9/1998 | Wong .................. G11C 27/005 365/45 |

(Continued)

FOREIGN PATENT DOCUMENTS

| | | |
|---|---|---|
| CN | 102341815 A | 2/2012 |
| CN | 103430186 A | 12/2013 |

(Continued)

OTHER PUBLICATIONS

Bojnordi, M., N., et al; "Memristive Boltzmann machine: A hardware accelerator for combinatorial optimization and deep learning"; Mar. 12, 2016. pp. 1-13.

(Continued)

*Primary Examiner* — Matthew D Sandifer
(74) *Attorney, Agent, or Firm* — Hewlett Packard Enterprise Patent Department (57) ABSTRACT

In some examples, a device includes a first processing core comprising a resistive memory array to perform an analog computation, and a digital processing core comprising a digital memory programmable with different values to perform different computations responsive to respective different conditions. The device further includes a controller to selectively apply input data to the first processing core and the digital processing core.

20 Claims, 6 Drawing Sheets

(56) References Cited

U.S. PATENT DOCUMENTS

| | | | |
|---|---|---|---|
| 7,912,889 | B1 | 3/2011 | Juffa et al. |
| 8,836,708 | B2 | 9/2014 | Letellier et al. |
| 8,959,136 | B1 | 2/2015 | Cheung et al. |
| 9,143,134 | B1 | 9/2015 | Kutz et al. |
| 9,152,827 | B2 | 10/2015 | Linderman et al. |
| 9,191,241 | B2 | 11/2015 | Thevenin et al. |
| 9,640,256 | B1 | 5/2017 | Roy et al. |
| 9,715,655 | B2 | 7/2017 | Wu et al. |
| 9,847,125 | B2 | 12/2017 | Friedman et al. |
| 9,910,827 | B2 | 3/2018 | Muralimanohar et al. |
| 2014/0129498 | A1 | 5/2014 | Bichler et al. |
| 2014/0172937 | A1 | 6/2014 | Linderman et al. |
| 2014/0281184 | A1 | 9/2014 | Dong et al. |
| 2015/0113223 | A1 | 4/2015 | Brown et al. |
| 2017/0124025 | A1 | 5/2017 | Gokmen |
| 2017/0228345 | A1* | 8/2017 | Gupta .................. G06G 7/19 |
| 2017/0316827 | A1 | 11/2017 | Ge et al. |
| 2018/0082732 | A1 | 3/2018 | Luo et al. |
| 2019/0034201 | A1* | 1/2019 | Muralimanohar ........ G06J 1/00 |
| 2019/0205741 | A1* | 7/2019 | Gupta .................. G06F 17/13 |

FOREIGN PATENT DOCUMENTS

| | | | |
|---|---|---|---|
| CN | 103778468 A | 5/2014 | |
| DE | 102018219313 A1 * | 5/2020 | ............. G06F 17/16 |
| WO | WO-2016018397 | 2/2016 | |
| WO | WO-2017131792 | 8/2017 | |
| WO | WO-2017171771 | 10/2017 | |

OTHER PUBLICATIONS

Lifan Xu et al, Scaling Deep Learning on Multiple In-Memory Processors, Dec. 8, 2015, 7 Pgs.

Mahdi Nazm Bojnordi et al, Memristive Boltzmann Machine: A Hardware Accelerator for Combinatorial Optimization and Deep Learning, Mar. 12-16, 2016, 13 Pgs.

Ni, L. et al.; "An Energy Efficient Matrix Multiplication Accelerator by Distributed in Memory Computing on Binary Rram Crossbar"; Jan. 25-28, 2016; 6 pages.

Ovtcharov et al., "Accelerating Deep Convolutional Neural Networks Using Specialized Hardware", http://research.microsoft.com/pubs/240715/cnn%20whitepaper.pdf (Research Paper), Feb. 22, 2015, 4 pages.

Shafiee et al., ISAAC: A Convolutional Neural Network Accelerator with In-Situ Analog Arithmetic in Crossbars, 2016 (13 Pages).

Sharad, M., et al; "Energy-Efficient Non-Boolean Computing With Spin Neurons and Resistive Memory"; Jan. 1, 2014. pp. 23-34.

Extended European Search Report received for EP Patent Application No. 16894800.8, dated Feb. 13, 2018, 09 pages.

International Search Report and Written Opinion received for PCT Application No. PCT/US18/30125, dated Feb. 27, 2019, 11 pages.

International Search Report and Written Opinion received for PCT Application No. PCT/US2016/025151, dated Dec. 28, 2016, 12 pages.

* cited by examiner

RESISTIVE AND DIGITAL PROCESSING CORES

GOVERNMENT LICENSE RIGHTS

This invention was made with government support under Contract No. IARPA 2017-17013000002 awarded by the Office of the Director of National Intelligence. The government has certain rights in the invention.

BACKGROUND

Resistive memory cells can be implemented as memristors, which are devices that may be programmed to different resistive states by applying electrical voltage or currents to the memristors. After programming states of the memristors, the memristors may be read. The state of a memristor remains stable over a specified time period long enough to regard the device as non-volatile. A number of memristors may be included within a crossbar array in which a number of column lines intersect with a number of row lines at junctions, and the memristors are coupled to the column lines and row lines at the junctions.

BRIEF DESCRIPTION OF THE DRAWINGS

Some implementations of the present disclosure are described with respect to the following figures.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

In some applications, a resistive memory array including resistive memory cells (e.g., memristors) can be used to perform matrix operations. A matrix operation refers to an operation where a matrix is subject to a mathematical computation (e.g., a multiplication, a convolution, etc.) with input data. The input data can be in the form of a vector, for example. In examples where the resistive memory cells are memristors, the resistive memory array can be referred to as memristive crossbar array.

Although the ensuing discussion refers to resistive memory arrays that include memristors, it is noted that in other examples, different types of resistive memory cells can be employed. A resistive memory cell refers generally to a memory cell that represents data using a resistance of the memory cell. For example, a first resistance of the memory cell represents a first data state, a second resistance of the memory cell represents a second data state, and so forth. Examples of other resistive memories include phase-change memories, magnetic memories (MRAMs), and so forth.

A resistive memory array includes a number of row lines and a number of column lines intersecting the row lines to form a number of junctions or cross-points, and a number of memristors coupled between the row lines and the column lines at the junctions.

A resistive memory array is pre-programmed with an array of values that represent values of a matrix that is to be multiplied with an input. The programming of the resistive memory array sets the resistance of each resistive memory cell in the resistive memory array, where the resistance (or conversely, conductance) of a resistive memory cell represents a respective value of the matrix.

After the resistive memory array is pre-programmed with values of a matrix, an input data (e.g., an input vector) can be applied to the resistive memory array to perform a computation with the matrix. Each element of the input vector can be converted into an analog input voltage and applied to each corresponding row line of the resistive memory array. The input voltage at each row line of the resistive memory array is weighted by the conductance of the resistive memory cells in each column line and accumulated as the current output from each column line. The foregoing operation involving the input vector and the matrix represented by the resistive memory cells of the resistive memory array is performed in the analog domain, since both the input data and the matrix data are in analog form.

If wire resistances can be ignored, the electrical current values, I (in vector form), flowing out of the resistive memory array is approximately $I^T = V^T G$, where V represents the input voltages (in vector form), and G is the conductance matrix, including contributions from each resistive memory cell in the resistive memory array. The indication "T" indicates that the respective vector I or V is transposed.

In some computing applications, for example deep learning applications such as neural network applications, logical operations can be carried out in multiple processing layers. In some cases, the output of one processing layer can be used as an input in another processing layer. A logical operation can involve a matrix operation that can be performed in the analog domain using a resistive memory array. In some examples, a matrix operation may be performed as part of a convolution operation, where an input is convolved with a matrix operand (referred to as an n×n kernel). Examples of deep learning applications include big data analysis, image recognition, speech recognition, machine learning, and other computationally complex tasks.

In example applications where there are a large number of matrix operations, implementing such matrix operations using resistive memory arrays can accelerate the matrix operations such that the matrix operations can be performed more quickly and efficiently than if performed using digital processors. The resistive memory arrays are accelerators separate from the digital processors that can be used for certain operations to reduce overall processing time in performing a set of operations.

Once a resistive memory array is pre-programmed with matrix values, the resistive memory array retains these programmed values (exhibits non-volatility) for an extended duration and is generally not changed during a process. As a result, the pre-programmed resistive memory array applies the same matrix to input data each time the resistive memory array is used to perform a corresponding matrix operation. The reason that data stored in a resistive memory array is not changed during computer operations is that re-programming the resistive memory array can be slow due to long programming times for each memristor and many memristors in an n×n array.

If a number of resistive memory arrays are used to implement a number of matrix operations, then it may be expected that the respective matrices stored in the corresponding memristive crossbar arrays do not change over time (at least during the course of a set of operations associated with a given application). However, this expectation that the programmed values of the resistive memory arrays remain static can pose a challenge in applications where dynamic data processes are performed. A dynamic data process involves conditional operations where a first condition being true leads to performance of a first operation, but a second condition being true leads to performance of a different second operation. A dynamic data process can involve a large number of conditional operations.

Multiple different resistive memory arrays can be implemented to perform the conditional different operations. For example, a first resistive memory array is used to perform a first operation in response to a first condition being true, and a different second resistive memory array is used to perform another operation in response to a second condition (e.g., the first condition not being true).

However, deploying different resistive memory arrays for performing different conditional operations may be inefficient, particularly if a dynamic data process involves a large number of conditional operations that branch at multiple points of the dynamic data process. Increasing the number of resistive memory arrays to perform conditional operations takes up valuable space in devices (e.g., integrated circuit dies) in which the resistive memory arrays are included.

Figure 1:
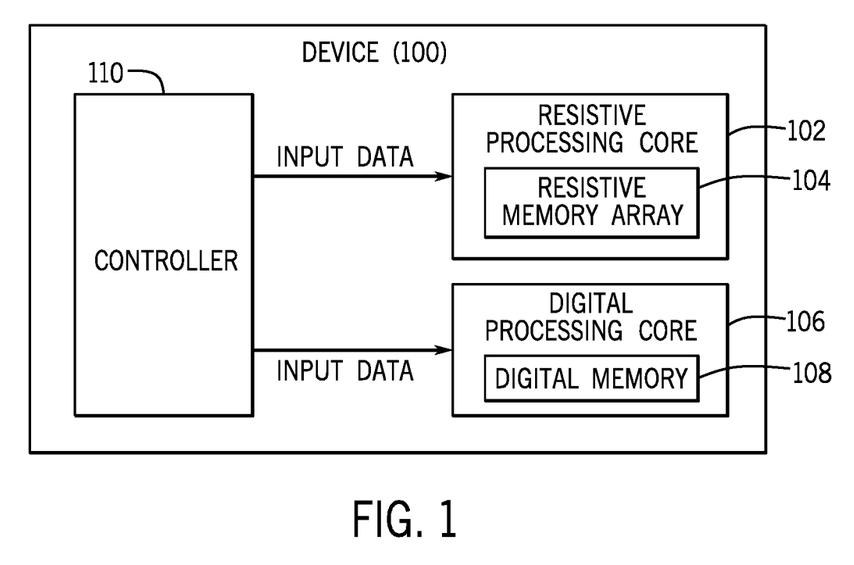
FIG. 1 is a block diagram of a device that includes different processing cores including a resistive processing core that has a resistive memory array and another processing core that is a digital processing core, according to some examples.

In accordance with some implementations of the present disclosure, as shown in FIG. 1, a device 100 can include both a resistive processing core 102 including a resistive memory array 104 to perform an analog computation, and a digital processing core 106 including a digital memory 108 programmable with different values to perform different computations responsive to respective different conditions. As a result, conditional operations of a dynamic data process can be performed using the digital processing core, instead of using different resistive processing cores.

The device 100 further incudes a controller 110 that can selectively apply input data to the resistive processing core 102 and the digital processing core 106. The controller 110 can also program values in the digital memory 108 of the digital processing core 106, as well as perform pre-programming of the resistive memory array 104 of the resistive processing core 102.

To perform a conditional operation, the digital memory 108 of the digital processing core 106 can be programmed with a corresponding set of values (e.g., values of a matrix) that depends on which condition is true. If a first condition is true, then the controller 110 can program a first set of values into the digital memory 108 to perform a first operation. If a second condition (different from the first condition) is true, then the controller 110 can program a second set of values into the digital memory 108 to perform a second operation different from the first operation.

The device 100 can be an integrated circuit die (e.g., an integrated circuit chip, a stacked arrangement of dies, etc.) on which the resistive processing core 102, the digital processing core 106, and the controller 110 are formed. In other examples, the device 100 can be in the form of a circuit board, an electronic device, and so forth. The controller 110 can be implemented as a microprocessor, a core of a multi-core processor, a microcontroller, a programmable integrated circuit device, a programmable gate array, or any other hardware processing circuit. In some examples, the controller 110 can be implemented using just a hardware processing circuit. In other examples, the controller 110 can be implemented using a combination of a hardware processing circuit and machine-readable instructions (software and/or firmware) executable on the hardware processing circuit.

Figure 2:
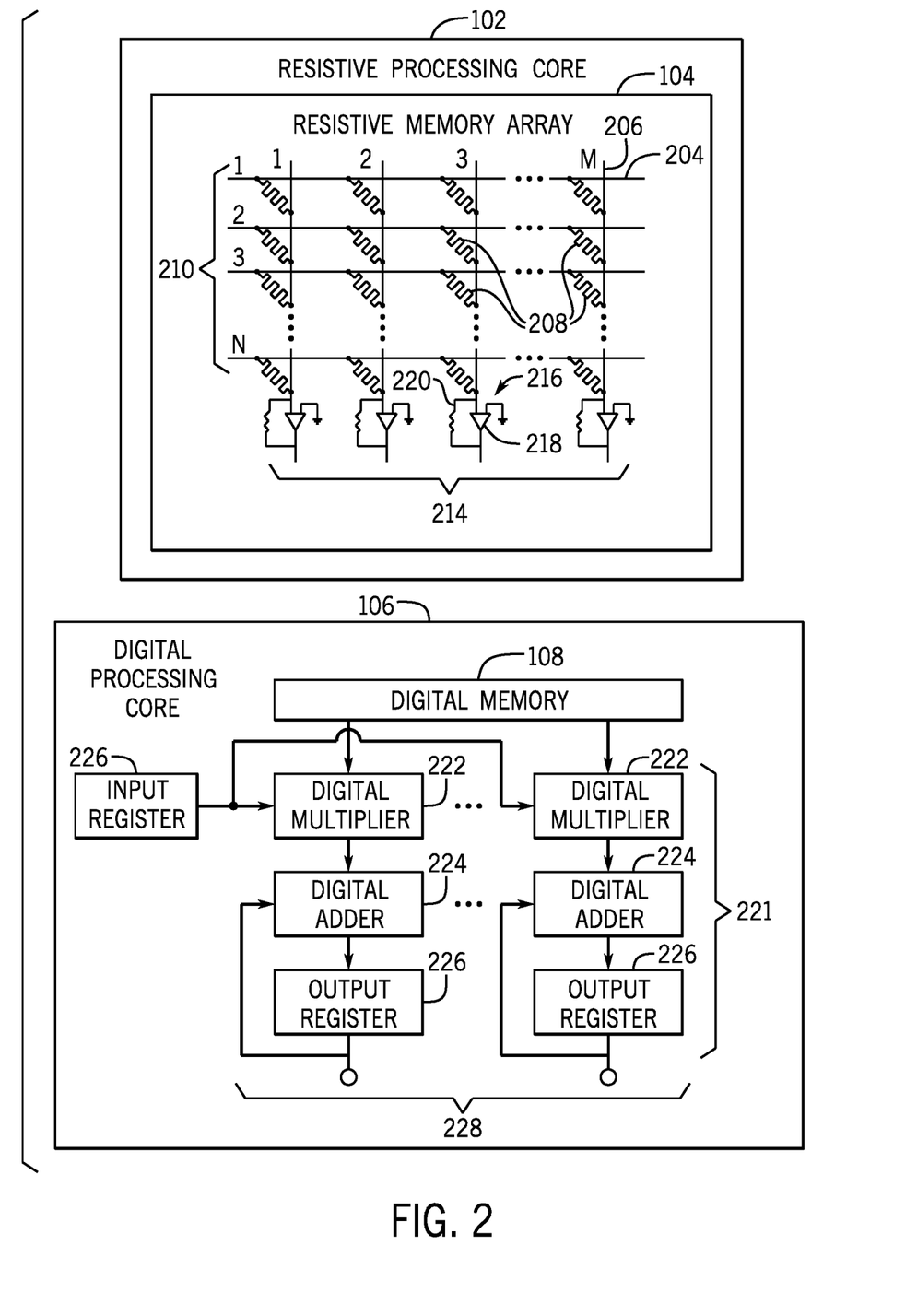
FIG. 2 is a block diagram that shows different processing cores according to further examples.

FIG. 2 shows an example of the resistive processing core 102 and the digital processing core 106, according to further examples.

The resistive memory array 104 (also referred to as a resistive crossbar array) of the resistive processing core 102 includes a plurality of row lines 204, a plurality of column lines 206, and a plurality of resistive memory cells 208. A resistive memory cell 208 may be coupled between each unique combination of one row line 204 and one column line 206. In the example of FIG. 2, there are N rows, and M columns, where N>2, and M>2.

The row lines 204 can include electrical conductors that carry current through the resistive memory array 104. In some examples, the row lines 204 may be parallel to each other. Similarly, the column lines 206 can include electrical conductors that may be parallel to each other, and the column lines are non-parallel (e.g., perpendicular) to the row lines 204.

A resistive memory cell 208 has a resistance that changes with an applied programming voltage or current pulse with a magnitude that exceeds a programming threshold or exceeds a pulse duration threshold. Once programmed, the resistance of the resistive memory cell 208 is maintained for a specified time period long enough to regard the resistive memory cell 208 as non-volatile. In some examples, a resistive memory cell 208 is settable to multiple resistance states, which may facilitate various analog operations. The multiple resistance states may allow the representation of various values in a matrix.

In some examples, the resistive memory cells 208 can be implemented as memristors. A memristor includes a memristor switching layer sandwiched between metal layers (that form the electrodes of the memristor). The memristor switching layer can include a nitride-containing composition, an oxide-containing composition, both a nitride-containing composition and an oxide-containing composition, and so forth. Examples of oxide-containing compositions of the memristor switching layer include any or some combination of the following: tantalum oxide, hafnium oxide, titanium oxide, yttrium oxide, niobium oxide, zirconium oxide, zinc oxide, nickel oxide, iron oxide, cobalt oxide, tungsten oxide, aluminum oxide, calcium oxide, magnesium oxide, dysprosium oxide, lanthanum oxide, silicon dioxide, and so forth. Examples of nitride-containing compositions of the memristor switching layer include any or some combination of aluminum nitride, gallium nitride, tantalum nitride, silicon nitride, oxynitrides such as silicon oxynitride, and so forth.

The memristor switching layer of a memristor changes resistance depending upon a potential difference that has been applied across the electrodes of the memristor or a current sourced through the device. Each memristor has a switching voltage or current that refers to a voltage or current used to switch the state of the memristor. When the supplied voltage or current is greater than the memristor switching voltage or memristor switching current, the memristor switches state, i.e., the resistance of the memristor changes. If the flow of charge is stopped by turning off the applied voltage or applied current, the memristor will "remember" the last resistance that it had. The resistance of the memristor can be detected to read the state stored in the memristor.

In some examples, each resistive memory cell 208 can include other components (not shown), such as an access transistor. An access transistor can be controlled (such as by a row line 204) between an activated state and a deactivated state. If activated, the access transistor electrically connects the access transistor to the corresponding column line 206. The access transistors can be used to activate a selected individual memory cell 208 or a group of memory cells 208 to program or read.

The memory cells 208 of the resistive memory array 104 can be programmed according to values of an input matrix. The resistance values stored in the memory cells 208 can represent the values of the input matrix. Selected memory cells 208 can be programmed, for example, by having programming signals driven through them by the row lines 206, which drives a change in the resistance range of the selected memory cells 208. The programming signals can define the values to be applied to the selected memory cells. To set a resistance of a memristor, a respective programming signal is set to a voltage that exceeds the corresponding switching voltage threshold.

Once the resistive memory cells 208 of the resistive memory array 104 has been programmed with matrix values, the resistive memory array 104 can be used in a matrix operation. To perform the matrix operation, input voltages 210 are applied at the row lines 204. The input voltages 210 may have been converted from an input vector by a digital-to-analog converter (DAC) (not shown). A drive circuit may deliver the analog input voltages 210 to the resistive memory array 104. The input voltages 210 are read voltages that have lower magnitudes than voltages used to program the resistive memory cells 208.

The input voltages 210 representing vector values interact with the resistive memory cells 208 at the corresponding junctions, to produce resulting electrical currents output along the column lines 206. The sum of each column line j (206) is represented by $\Sigma v_i g_{i,j}$, where $v_i$ is the voltage applied along row line i (204), and $g_{i,j}$ is the conductance of the resistive memory cell 208 at the junction of row line i and column line j. The sum of each column line j determines the resulting electrical current output by the column line j.

The multiple column lines 206 output corresponding electrical currents representing respective sums. Current amplifiers 216 transform the respective electrical currents output by the column lines 206 to corresponding output voltages 214. In some examples, each current amplifier 216 is a transimpedance amplifier. A transimpedance amplifier is a current to voltage converter, implemented using an operational amplifier 218 and resistor 220, for example.

The output voltages 214 (in analog form) can represent analog multiplication results of the input voltages 210 and the matrix values stored in the resistive memory cells 208 of the resistive memory array 104. In some examples, the analog output voltages 214 can be converted by an analog-to-digital converter (ADC) (not shown) to a set of digital results representing a vector-matrix multiplication of the input vector with the input matrix.

The digital results can be output by the resistive processing core 102 to another circuit.

The digital processing core 106 shown in FIG. 2 includes the digital memory 108, which can be implemented as a static random access memory (SRAM), a dynamic random access memory (DRAM), or any other type of random access memory with a write access speed that is greater than the write access speed of the resistive memory array 104. The digital processing core 106 further includes digital logic 221, which is used to perform mathematical operations in the digital domain based on values stored in the digital memory 108.

In the example shown in FIG. 2, the digital logic 221 includes digital multipliers 222 and digital adders 224. An input register 226 stores input data values (which can represent values of an input vector) that are to be multiplied or otherwise combined with matrix values stored in the digital memory 108. The output of the input register 226 is provided to respective first inputs of the digital multipliers 222, and the output of the digital memory 108 is provided to respective second inputs of the digital multiplier 222. Each digital multiplier 222 multiplies the input vector (represented by the input values of the input register 226) with a corresponding portion of the matrix stored by the digital memory 108. The output of the digital multiplier 222 is provided to a digital adder 224, which adds a current value stored in a respective output register 226 with the output of the digital multiplier 222. The outputs of the output register 226 forms the output values that represent the multiplication of the input vector with the matrix.

To perform different matrix operations, the digital memory 108 can be written with different matrix values to be multiplied with an input vector. For example, depending upon whether a first condition or a second condition is true, the digital memory 108 can be programmed with a first matrix or a second matrix (different from the first matrix). Dynamically programming different matrices into the digital memory 108 in response to different conditions is feasible since the digital memory 108 can be written at a higher speed than the resistive memory array 104 of the resistive processing for 102.

Figure 3:
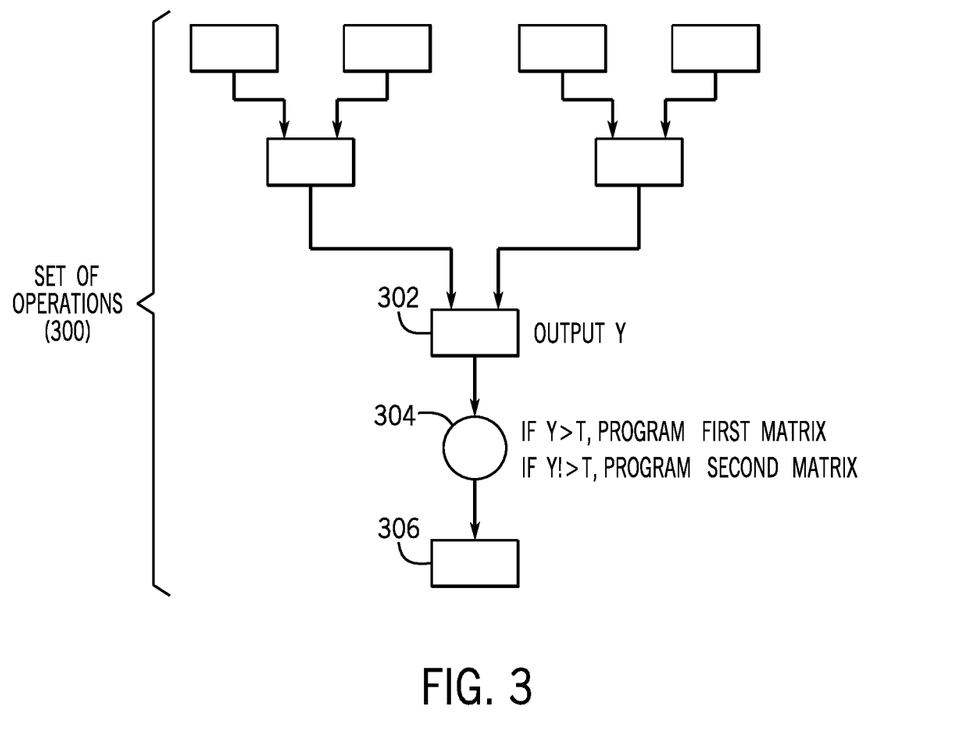
FIG. 3 is a block diagram illustrating a set of operations, where some of the operations can be performed using resistive processing cores including resistive memory arrays and another operation is performed using a digital processing core, according to additional examples.

FIG. 3 illustrates an example set of operations 300 of a dynamic data process. In FIG. 3, each rectangle represents an operation performed by a corresponding resistive processing core 102. A circle in FIG. 3 represents an operation 304 performed by a digital processing core 106.

The operation 304 performed by the digital processing core 106 in FIG. 3 is a conditional operation that depends upon the value of an output Y produced by an operation 302 (as implemented by a corresponding resistive processing core 102). In the example of FIG. 3, if Y is greater than T (an example of a "first condition"), then the operation 304 is a first matrix operation that involves a first matrix. Under this first condition, a first matrix is programmed into the digital memory 108 of the digital processing core 106. On the other hand, if Y is not greater than T (an example of a "second condition"), then the operation 304 is a second matrix operation that involves a second matrix that is different from the first matrix. Under this second condition, the second matrix is programmed into the digital memory 108 of the digital processing core 106. The output of the operation 304 is provided to the next operation 306, which can be implemented by a corresponding resistive processing core 102.

Figure 4:
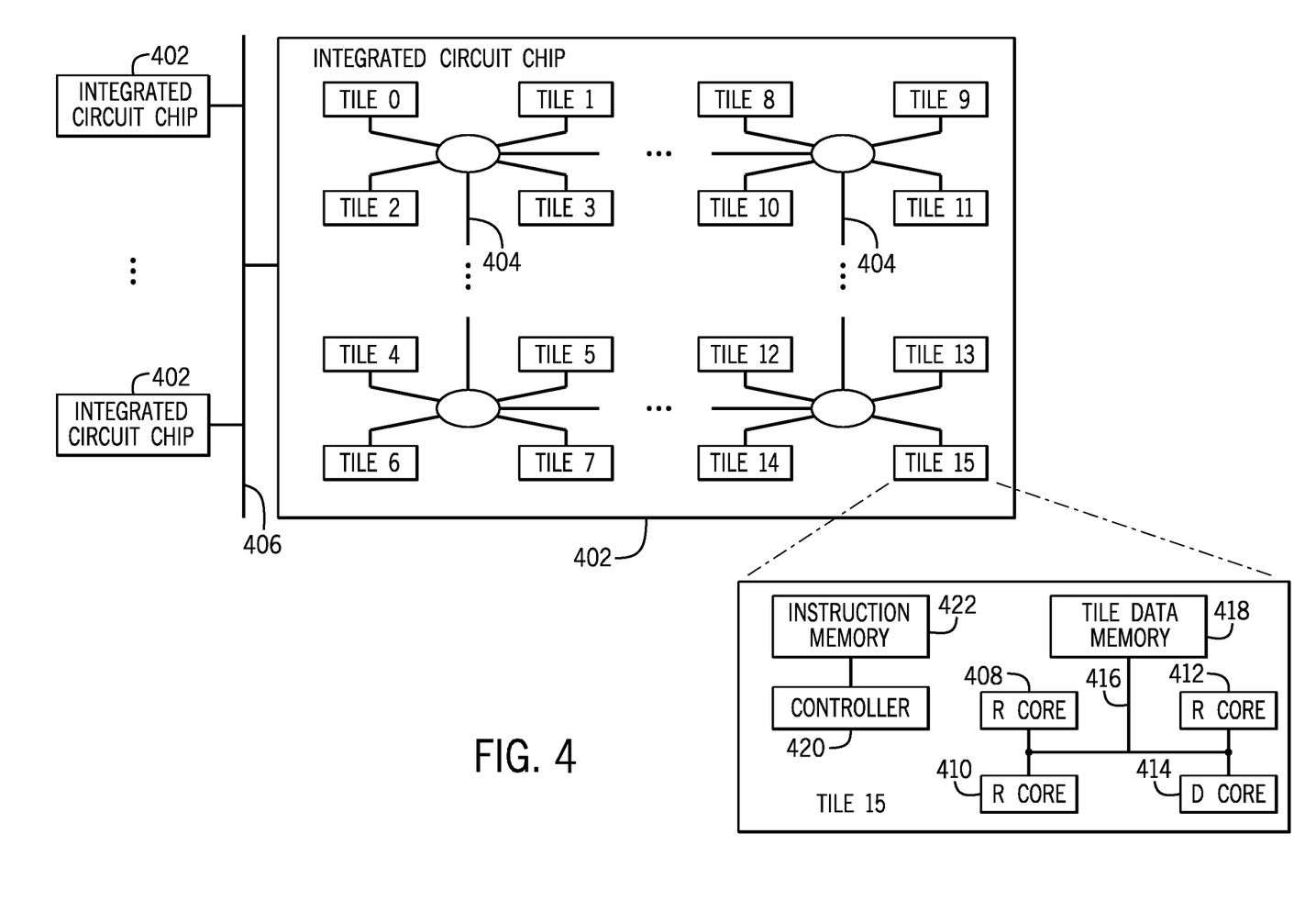
FIG. 4 is a block diagram of a device having multiple tiles, where a tile includes different processing cores according to alternative examples.

FIG. 4 is a block diagram of an example system that includes multiple integrated circuit chips 402. The system of FIG. 4 can include a computer or multiple computers.

Each integrated circuit chip 402 can have an arrangement of tiles (tile 0 to tile 15 shown in the example). The tiles in the integrated circuit chip 402 are connected over an on-chip interconnect network 404. Although a specific number of tiles are shown in each integrated circuit chip 402, it is noted that in different examples, different numbers of tiles can be included in the integrated circuit chip 402. A tile can refer generally to a collection of processing cores and related circuitry. Different integrated circuit chips 402 can have the same tile arrangement or can have different tile arrangements.

An integrated circuit chip 402 is connected to another integrated circuit chip 402 over a chip-to-chip interconnect network 406.

FIG. 4 also shows components of tile 15. The other tiles of the integrated circuit chip 402 can have the same arrangement or can have different arrangements than tile 15. Tile 15 includes multiple processing cores, including resistive processing cores 408, 410, and 412, and a digital processing core 414. Each of the resistive processing cores 408, 410, and 412 is similar to the resistive processing core 102 of FIG. 2, while the digital processing core 414 is similar to the digital processing core 106 of FIG. 2.

The processing cores 408, 410, 412, and 414 are connected over a tile interconnect 416, which is further connected to a tile data memory 418 to store input data (received by the tile) and output data computed by the processing cores 408, 410, 412, and 414 and stored into the tile data memory 418.

Tile 15 further includes a controller 420, which is similar to the controller 110 of FIG. 1. Tile 15 also includes an instruction memory 422 that stores machine-readable instructions that are executable on the controller 420 to cause the controller 420 to perform respective tasks. For example, the machine-readable instructions of the instruction memory 422 can include instructions corresponding to the set of operations 300 shown in FIG. 3.

The controller 420 can control the selective application of input data to the processing cores 408, 410, 412, and 414, and the selective activations of the processing cores 408, 410, 412, and 414. The controller 420 can also control the dynamic programming of values into the digital memory of the digital processing core 414, as well as the pre-programming of values into resistive memory arrays of the resistive processing cores 408, 410, and 412.

Figure 5:
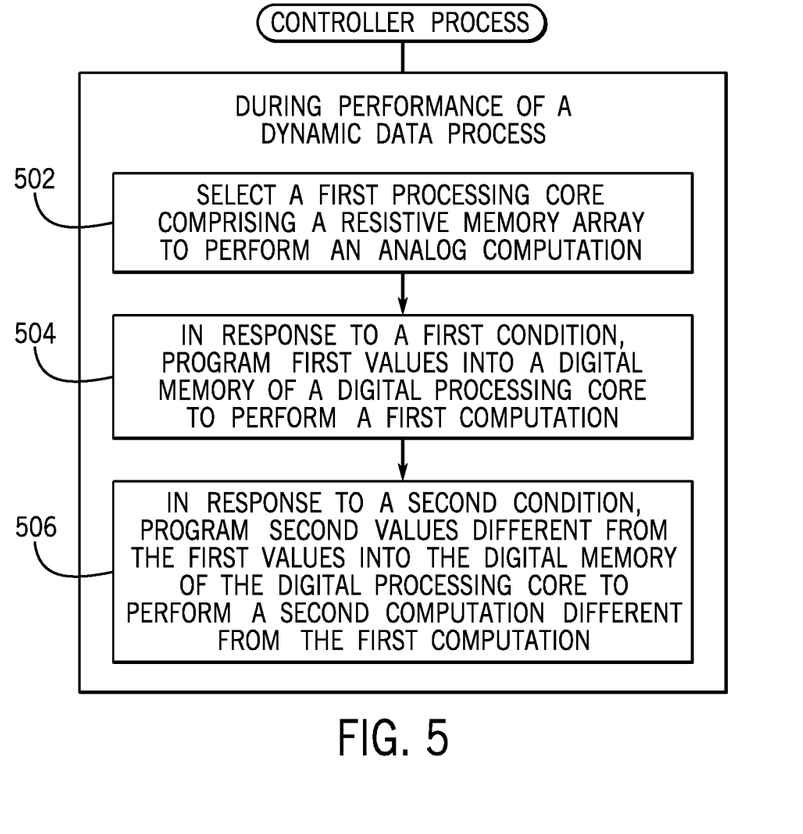
FIG. 5 is a flow diagram of a process of a controller according to some examples.

FIG. 5 is a flow diagram of a process performed by a controller, such as the controller 110 of FIG. 1, the controller 420 of FIG. 4, or a different controller. During performance of a dynamic data process, the controller performs the following tasks. The controller selects (at 502) a first processing core comprising a resistive memory array to perform an analog computation. The analog computation uses values programmed in resistive memory cells of the resistive memory array. The values can be pre-programmed in the resistive memory cells of the resistive memory array prior to performing the dynamic data process. In some examples, the values programmed in the resistive memory cells of the resistive memory array remain static during the dynamic data process.

In response to a first condition, the controller programs (at 504) first values into a digital memory of a digital processing core to perform a first computation.

In response to a second condition, the controller programs (at 506) second values different from the first values into the digital memory of the digital processing core to perform a second computation different from the first computation.

During the performance of the dynamic data process that includes a set of operations, the controller identifies operations of the set of operations to be performed by resistive processing cores including respective resistive memory arrays, and identifies a conditional operation of the set of operations to be performed by the digital processing core.

Figure 6:
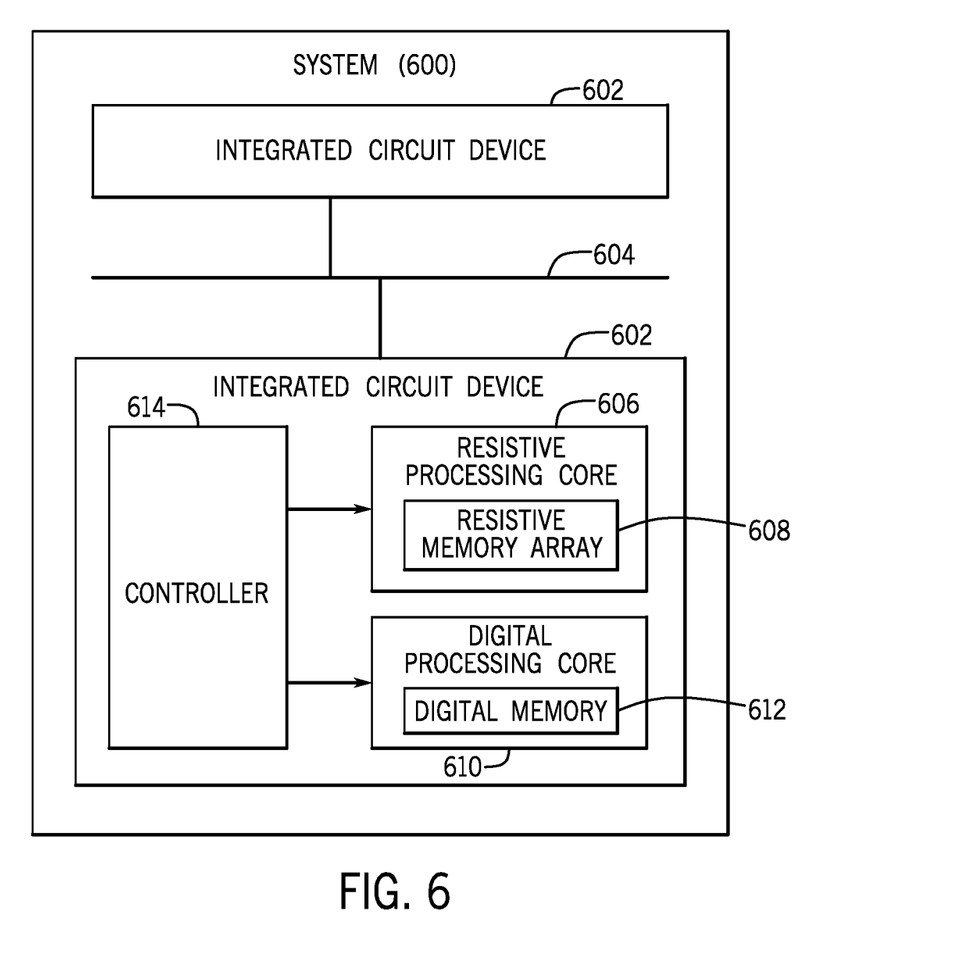
FIG. 6 is a block diagram of a system according to further examples.

FIG. 6 is a block diagram of a system 600 according to further examples. The system 600 includes a plurality of integrated circuit devices 602. A communication interconnect 604 interconnects the plurality of integrated circuit devices 602. An integrated circuit device of the plurality of integrated circuit devices includes a resistive processing core 606 comprising a resistive memory array 608 to perform an analog computation, a digital processing core 610 comprising a digital memory 612 programmable with different values to perform different computations responsive to respective different conditions, and a controller 614 to selectively apply input data to the resistive processing core 606 and the digital processing core 610.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A device comprising:
   a first processing core comprising a resistive memory array to perform an analog computation;
   a digital processing core comprising a digital memory programmable with different values to perform different computations responsive to respective different conditions; and
   a controller to selectively apply input data to the first processing core and the digital processing core.

2. The device of claim 1, wherein the digital memory of the digital processing core comprises a random access memory.

3. The device of claim 2, wherein the controller is to:
   program the digital memory with first values to perform a first computation; and
   program the digital memory with second values different from the first values to perform a second computation.

4. The device of claim 3, wherein the first and second computations are different matrix operations.

5. The device of claim 4, wherein the analog computation is a matrix operation involving a matrix programmed as values in resistive memory cells of the resistive memory array.

6. The device of claim 2, wherein the random access memory comprises a static random access memory or a dynamic random access memory.

7. The device of claim 1, wherein the digital processing core further comprises digital mathematical logic to perform a mathematical operation in a digital domain.

8. The device of claim 1, further comprising:
   a second processing core comprising a resistive memory array to perform an analog computation; and a storage medium to store machine-readable instructions that upon execution performs a dynamic data process that causes the controller to selectively apply respective input data to the first processing core, the second processing core, and the digital processing core during the dynamic data process.

9. A method comprising:
during performance of a dynamic data process:
selecting, by a controller, a first processing core comprising a resistive memory array to perform an analog computation;
in response to a first condition, programming, by the controller, first values into a digital memory of a digital processing core to perform a first computation; and
in response to a second condition, programming, by the controller, second values different from the first values into the digital memory of the digital processing core to perform a second computation different from the first computation.

10. The method of claim 9, wherein the first values and the second values correspond to different matrices, and the first and second computations comprise different matrix operations using respective matrices of the different matrices.

11. The method of claim 9, wherein the analog computation uses values programmed in resistive memory cells of the resistive memory array.

12. The method of claim 11, wherein the values programmed in the resistive memory cells of the resistive memory array remain static during the dynamic data process.

13. The method of claim 12, further comprising:
pre-programming the values in the resistive memory cells of the resistive memory array prior to performing the dynamic data process.

14. The method of claim 9, further comprising:
during the performance of the dynamic data process that includes a set of operations:
identifying, by the controller, operations of the set of operations to be performed by processing cores comprising respective resistive memory arrays; and
identifying, by the controller, a conditional operation of the set of operations to be performed by the digital processing core.

15. The method of claim 9, wherein programming the digital memory of the digital processing core comprises writing values used in the first computation or the second computation.

16. The method of claim 9, wherein the digital memory comprises a random access memory having a write access speed greater than a write access speed of the resistive memory array.

17. A system comprising:
a plurality of integrated circuit devices;
a communication interconnect that interconnects the plurality of integrated circuit devices,
wherein a first integrated circuit device of the plurality of integrated circuit devices comprises:
a first processing core comprising a resistive memory array to perform an analog computation;
a digital processing core comprising a digital memory programmable with different values to perform different computations responsive to respective different conditions; and
a controller to selectively apply input data to the first processing core and the digital processing core.

18. The system of claim 17, wherein the first integrated circuit device comprises a plurality of tiles, wherein a first tile of the plurality of tiles comprises the first processing core, the digital processing core, and the controller.

19. The system of claim 18, wherein a second tile of the plurality of tiles comprises:
a second processing core comprising a resistive memory array to perform an analog computation;
a second digital processing core comprising a digital memory programmable with different values to perform different computations responsive to respective different conditions; and
a controller to selectively apply input data to the second processing core and the second digital processing core.

20. The system of claim 17, wherein the digital processing core further comprises a digital mathematical logic to perform a mathematical operation using values programmed in the digital memory.

* * * * *